United States Patent
Huang et al.

(10) Patent No.: US 6,924,215 B2
(45) Date of Patent: Aug. 2, 2005

(54) METHOD OF MONITORING HIGH TILT ANGLE OF MEDIUM CURRENT IMPLANT

(75) Inventors: Hung-Ta Huang, Ilan (TW); Hsueh-Li Sun, Youkan (TW); Juinn-Jie Chang, Tainan (TW); Stanley Huang, Tainan (TW); Jih-Churng Twu, Chung-Ho (TW); Tom Tseng, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 461 days.

(21) Appl. No.: 10/157,558

(22) Filed: May 29, 2002

(65) Prior Publication Data

US 2003/0224541 A1 Dec. 4, 2003

(51) Int. Cl.[7] .................... H01L 21/336; H01L 21/331; H01L 21/425; H01L 21/36; H01L 21/265
(52) U.S. Cl. ................. 438/506; 438/302; 438/373; 438/514; 438/519
(58) Field of Search .................. 438/373, 506, 438/514, 519, 527, 302

(56) References Cited

U.S. PATENT DOCUMENTS

| | | | |
|---|---|---|---|
| 5,226,118 A | * | 7/1993 | Baker et al. ................. 715/833 |
| 5,308,780 A | * | 5/1994 | Chou et al. .................. 438/302 |
| 5,344,787 A | * | 9/1994 | Nagalingam et al. ........ 438/298 |
| 5,914,499 A | * | 6/1999 | Hermansson et al. ......... 257/77 |
| 6,232,619 B1 | * | 5/2001 | Chen et al. .................... 257/48 |
| 6,287,880 B1 | * | 9/2001 | Erickson et al. .............. 438/17 |
| 6,777,251 B2 | * | 8/2004 | Lu et al. ....................... 438/14 |
| 6,815,229 B1 | * | 11/2004 | Halliyal et al. ............... 438/14 |
| 2002/0124791 A1 | * | 9/2002 | Ito ............................... 117/13 |

FOREIGN PATENT DOCUMENTS

| JP | 362145729 | * | 6/1987 |
|---|---|---|---|
| JP | 40512917 | * | 5/1993 |

* cited by examiner

Primary Examiner—Craig A. Thompson
Assistant Examiner—James M. Mitchell
(74) Attorney, Agent, or Firm—Tung & Associates

(57) ABSTRACT

A method of monitoring and adjusting the position of a wafer with respect to an ion beam including setting the position of a wafer holder so that a wafer to be held therein is positioned at a tilt angle of 45 degrees and a twist angle of 45 degrees with respect to the path of an ion beam; positioning a n-type wafer without screen oxide in the wafer holder; implanting boron species into a region of the wafer at 160 KeV and a dose level of $5.0 \times 10^{13}$ atoms/cm$^2$; periodically measuring the sheet resistivity of a implanted wafer and readjusting the wafer tilt angle when the sheet resistivity is greater than 30 ohms/square.

6 Claims, 1 Drawing Sheet

[n-<100>]

[n-<111>]

[p-<111>]

[p-<100>]

METHOD OF MONITORING HIGH TILT ANGLE OF MEDIUM CURRENT IMPLANT

FIELD OF THE INVENTION

This invention relates to a method of monitoring and adjusting the tilt angle of a semiconductor wafer for ion implantation.

BACKGROUND OF THE INVENTION

One of the most important properties of semiconductor materials is that the semiconductor material conductivity can be controlled by adding dopants. Semiconductor materials such as silicon (Si), germanium (Ge), and gallium-arsenate (GaAs) are doped with either n-type or p-type dopants in typical integrated circuit fabrication processes. Heretofore, diffusion and ion implantation have been the two primary methods used to doped semiconductors. However, in modern integrated circuit fabrication processes, doping is mainly accomplished by ion implantation.

Pure single-crystal silicon has a high resistivity, and the more pure the crystal, the higher the resistivity. The conductivity of single-crystal silicon can be improved by adding dopants, such as boron (B), phosphorus (P), arsenic (As) or antimony (Sb). Boron is a p-type dopant with only three electrons in the outer valence shell or orbit. A boron atom provides a hole by replacing a silicon atom (that has four electrons in the outer valence shell) in the single-crystal silicon lattice. Holes can carry electrical current which acts as a positive charge. Semiconductor devices doped with boron are called p-type semiconductors. Phosphorus, arsenic and antimony atoms have five electrons in the outer valence shell so they can provide electrons to conductive electrical current when they replace a silicon atom in the single-crystal silicon wafer. Because the additional electron has a negative charge, phosphorus, arsenic and antimony are called n-type dopants, and the semiconductors with these dopants are called n-type semiconductors.

Traditionally, doping was accomplished using a diffusion process in high-temperature furnaces. The area where the furnaces were located was called the diffusion bay, and the furnaces were called diffusion furnaces, even though the furnaces have been used for diffusion or other processes such as oxidation or annealing. Currently, few diffusion doping processes are performed in advance integrated circuit manufacturing facilities, and the furnaces have been used mainly for oxidation and annealing. However, the furnace area in most integrated circuit fabrication facilities is still called the diffusion bay and the furnaces are still called diffusion furnaces.

The diffusion process usually involves multiple steps. A dopant oxide layer is normally deposited on the wafer surface in a predeposition process. Thereafter, an oxidation process converts the dopant oxide into silicon dioxide and forms a high concentration of dopant in the silicon substrate near the silicon-silicon dioxide interface. A high-temperature drive-in process diffuses the dopant atoms into the substrate to the depth required for desired devices. The three processes: predeposition; oxidation; and drive-in are high temperature processes usually taking place in furnaces. After the dopant drive in, the oxide layer is stripped by a wet etching process.

However, the diffusion process has a number of limitations. The dopant concentration and junction depth cannot be independently controlled, because both are strongly related to the diffusion temperature. Another major disadvantage is that the dopant profile as always isotropic due to the nature of the diffusion process. Consequently, an alternative and better process was being sought of those working in the art.

An ion implantation process provides for much better control of doping than the diffusion process. Ion implantation adds dopant atoms into the silicon wafer using energetic ion beam injection. Contrary to the diffusion process, ion implementation can independently control both dopant concentration and junction depth. The dopant concentration can be controlled by the combination of ion beam current and implantation time, and the junction depth can be controlled ion energy. The ion implantation process can dope the silicon with a wide range of doping concentrations ranging from $10^{11}$ to $10^{17}$ atoms/cm$^2$. Although the diffusion process requires a thick oxide to be grown as the diffusion mask, ion implantation is a room temperature process, and a thick layer of photoresist can block the energetic dopant ions. Ion implantation can use photoresist as the patterning mask and does not need to grow silicon dioxide to form a hard mask as was required to the diffusion process. However, the wafer holder of an ion implanter must have a cooling system to take away the heat generated by the energetic ions and to prevent photoresist reticulation.

A mass analyzer of an ion implanter selects exactly the correct ion species needed for ion implantation and generates a pure ion beam thus eliminating the possibility of contamination. The ion implantation process is operated in a high vacuum, clean environment, and is anisotropic. Dopant ions are implanted into silicon primarily in a vertical direction, and the doped region clearly reflects the area identified by the photoresist mask. This is in contrast to the diffusion process which is isotropic and wherein the dopant always diffuses laterally underneath the silicon dioxide mask.

When ions bombard and penetrate the silicon substrate, they collide with lattice atoms. The ions generally lose their energy and eventually stop inside the silicon. There are two stopping mechanisms that are known. One is when the implanted ions collide with nuclei from the lattice atoms, are scattered significantly by collision, and transfer energy to the lattice atoms. This is called the nuclear stopping. In this hard collision, lattice atoms can get enough energy to break free from the lattice binding energy which causes crystal structure disorder and damage. Another stop mechanism is when incidental ions collide with electrons of the lattice atoms. The incidental ion path in the electronic collision is almost unchanged, energy transferred is very small, and crystal structure damage is minimal. This soft collision is called electronic stopping.

The ion energy of the ion implantation process range from also low energy of 0.5 keV for ultra-shallow junctions to high-energy of 1 MeV for well implantation. In general, the higher ion energy the deeper it can penetrate into the substrate. However, even with the same implantation energy, ions don not stop exactly at the same depth in the substrate because the ions each have different collisions with different atoms. The projected ion range always has a distribution.

Higher energy ion beams can penetrate deeper into the substrate, and therefore have a longer projected ion range. Since smaller ions have smaller collision cross-sections, smaller ions at the same energy level can penetrate deeper into the substrate and the mask materials.

The projected range of an ion in an amorphous material always follows a Gaussian distribution, also called the normal distribution. In a single-crystal silicon, the lattice atoms have an orderly arrangement, and many channels can be seen at different angles. If an ion enters the silicon at the right angle, it can travel long distance with very little energy if it enters the channel. This is called channeling effect. The channeling effect causes some ions to penetrate deeply into the single-crystal substrate. This can form a "tail" on the normal dopant distribution curve. It is an undesirable dopant profile which could affect the electronic device performance. Therefore, several methods have been used to minimize this effect.

One way to minimize the channeling effect is ion implantation on a tilted wafer, which typically is tilted an angle ranging from 0–7 degrees. When a tilted wafer is used, ions impact the wafer at an angle and cannot reach the channel. The incident ion have nuclear collisions right away, and effectively reduce the channeling effect. Most ion implantation processes use this technique to minimize channeling effect and most wafer holders used with an ion implanter have the capability of adjusting the tilt angle of the wafer.

Tilting the wafer may cause shadowing effects by the photoresist which can be solved by rotating the wafer and/or a small amount of dopant diffusion during post implantation annealing. However, if the tilt angle is too small, sometimes the dopant concentration in the silicon can form a hump distribution due to the channeling effect.

Referring now to FIG. 1, the manner in which the ion beam strikes the wafer is defined by the tilt and twist angle of the wafer with respect to the ion beam. The angle between the surface normal 14 and the ion beam 16 is the tilt angle. A non-zero tilt angle is typically used to avoid channeling effects in crystalline silicon, to introduce dopants into sidewalls of a trench or to implant dopants underneath the mask edge at a large tilt angle. Additionally, the twist angle is necessary to completely described the direction of incidence of the ion beam. The twist angle is the angle between the plane containing the ion beam 16 and the wafer normal 14, and the plane perpendicular to the primary flat 12 of the wafer 10 containing the wafer normal 14. The primary flat 12 defines the orientation of the silicon crystal. It is aligned to a (011) direction in a <100> oriented wafer. Besides the primary flat 12, a secondary flat is also used to identify a wafer type, and the secondary flat indicates the crystal orientation and background doping. The plane containing the normal to the wafer 14 and the ion beam 16 intersects the wafer surface at line 18.

Wafer types are identified by the orientation of the primary and secondary flat. The name of the wafer type indicates the background doping and the orientation of the wafer normal. FIGS. 2–5 illustrates a variety of different wafer types. FIG. 2 illustrates a semiconductor wafer of the n-<100> type. The semiconductor wafer is background doped with a negative species and includes a primary flat 12 and a secondary flat 22. A line 20 normal to the primary flat 12 forms a 180 degree angle with a line 24 normal to the secondary flat 22.

FIG. 3 illustrates a n-<111> type semiconductor wafer. This type of semiconductor wafer is background doped with a negative species and includes a primary flat 12 and a secondary flat 22. A line 20 normal to the primary flat 12 forms a 45 degree angle with respect to a line 24 normal to the secondary flat 22.

FIG. 4 illustrates a p-<111> semiconductor wafer. This wafer is background doped with a positive species and includes only a primary flat 12. FIG. 5 illustrates a p-<100> type semiconductor wafer. This type semiconductor wafer is background doped with a positive species and includes a primary flat 12 and a secondary flat 22. A line 20 normal to the primary flat 12 forms a 90 degree angle with a line 24 normal to the secondary flat 22.

In the manufacturing of semiconductor wafers, it is common to use ion beam implanter to implant ions into the semiconductor wafer to form a variety of semiconductor discrete devices. However, during the process of manufacturing numerous semiconductor wafers, the ion beam and/or wafer holder (and thus the wafer) can become misaligned. As semiconductor devices become smaller and smaller, the accuracy of the ion implantation becomes more and more important. It has been discovered that a tilt angle shift of two degrees in a pocket implant process will contribute to a variation of 20–30 millivolts in the threshold voltage of the discrete device. Currently there is an absence in the art of an accurate and reliable method of monitoring and adjusting the wafer tilt angle for high tilt angle pocket implantation. The present invention satisfies the need in the art.

SUMMARY OF THE INVENTION

One embodiment of the invention includes a method of monitoring and adjusting the position of a wafer with respect to an ion beam comprising:

(A) setting the position of a wafer holder so that wafers held therein are positioned at a tilt angle of 45 degrees and a twist angle of 45 degrees with respect to the path of an ion beam;

(B) positioning a n-type wafer without screen oxide in the wafer holder;

(C) implanting boron species into a region of the wafer at 160 KeV and a dose level of $5.0 \times 10^{13}$ atoms/cm$^2$;

(D) repeating (B)–(C);

(E) periodically measuring the sheet resistivity of an implanted wafer and readjusting the tilt angle of the wafer holder back to 45 degrees when the sheet resistivity is greater than 30 ohms/square.

Another embodiment of the invention includes a method of monitoring and adjusting the position of a wafer with respect to an ion beam comprising:

placing a first test wafer in a wafer holder positioned at a 45 degree tilt angle and a twist angle of 45 degrees with the anticipated path of an ion beam from an ion implanter;

implanting ions in a region of the first test wafer at a first energy and a first dose level, and measuring the sheet resistivity of the implanted region of the first test wafer;

implanting a plurality of production wafers with ions;

implanting ions in a region of a second test wafer at the first energy level and the first dose level, and measuring the sheet resistivity thereof and readjusting the position of the wafer holder so that the wafer has a 45 degree tilt angle if the sheet resistivity of the second wafer is greater than 30 ohms/square of the sheet resistivity measured for the first test wafer.

Another embodiment of the invention includes a method of monitoring and adjusting the wafer tilt angle to arrive at a tilt angle that is substantially at a true 45 degree angle comprising:

(A) holding a semiconductor wafer in a wafer holder in a first position believed to be approximating 45 degrees with respect to the anticipated path of an ion beam from an ion implanter, implanting ions into the wafer at a first energy and a first dose level, and measuring the sheet resistivity of the wafer implanted in the first implant position;

(B) holding the wafer in the wafer holder and tilting the wafer in a first direction to a second implant position, and implanting ions into the wafer at the first energy and first dose level, and measuring the sheet resistivity of the wafer implanted in the second implant position and comparing to the sheet resistivity measured in the immediately prior implant position of the wafer, and if the sheet resistivity of the wafer implanted in the second implant position is less than the sheet resistivity of the wafer implanted in the first immediately prior implant position of the wafer and the difference between the measured sheet resistivity of the wafer in the second implant position and immediately prior implant position is greater than a target range, for example 1–5 ohms/square, then repeating (B), and if the difference in the measured sheet resistivity is within the target range then stopping the monitoring and adjusting of the wafer tilt angle. If the sheet resistivity of the wafer implanted in the second implant position is greater than the sheet resistivity of the wafer implanted in the immediately prior implant position, and the difference between the sheet resistivity of the wafer implanted in the second position and the wafer implanted in the immediately prior implant position is greater than a target range then (C) holding the wafer in the wafer holder and tilting the wafer in the direction opposite to the direction that the wafer was tilted to arrive at the immediately prior implant position of the wafer in the holder to a third implant position, implanting ions into the wafer at the first energy and first dose level and measuring the sheet resistivity of the wafer implanted in the third implant position and comparing the sheet resistivity measured in the third implant position to the resistivity measured for the wafer implanted in the immediately prior implant position, and if the sheet resistivity of the wafer implanted in the third implant position is greater than the sheet resistivity of the wafer implanted in the immediately prior implant position, and if the difference between the sheet resistivity of the wafer implanted in the third implant position and the wafer implanted in the immediately prior implant position is greater than a target range, for example 1–5 ohms/square, then repeating (C), and if the difference in the measured sheet resistivity of the wafer implanted in the third implant position and the sheet resistivity wafer in the immediately prior implant position is within the target range then stopping the monitoring and adjusting of the wafer tilt angle.

In another embodiment of the invention the first energy is about 160 KeV.

In another embodiment of the invention the first dose is about $5.0 \times 10^{13}$ atoms/cm$^2$.

These and other objects, features and advantages of the present invention will become apparent from the following brief description of the drawings, detailed description of the preferred embodiments, and appended claims and drawings.

DETAILED DESCRIPTION OF THE PREFERRED EMBODIMENTS

Dopant species, junction depth and dopant concentration are the most important factors to control and measure in an ion implantation process. Dopant species can be determined by a mass analyzer of an ion implanter. Dopant concentration is determined by the ion beam current and the implantation time. A four-point probe is the most common measurement tool use in implantation process monitoring. A four-point probe measures sheet resistance of the silicon surface. The sheet resistance ($R_s$) is defined as the resistivity divided by the thickness of the doping junction. The resistivity is mainly determined by dopant concentration and thickness is mainly determined by the doping junction depth. The dopant junction depth is controlled by the dopant ion energy. Consequently, sheet resistance measurement can give information about dopant concentration, since the junction depth can be estimated by knowing the ion energy, ion species, and the substrate materials.

The four point probe is employed to measure sheet resistance by applying a certain amount of current between two pins and measuring the voltage difference between the other two pins from which the sheet resistance can be calculated. The four point probe measurement usually is performed after the annealing process, which is used to make decisions about repairing the damaged crystal structure and activating the dopants. Because the four point probe makes direct contact with the wafer surface, it is primarily used for testing wafers, for process development, qualification and controlling. In operation, the probe must contact the silicon surface with enough force so that the pins break any oxide thereon in order to make direct contact with the silicon substrate. Sheet resistivity is measured in ohms/square.

Figure 1:
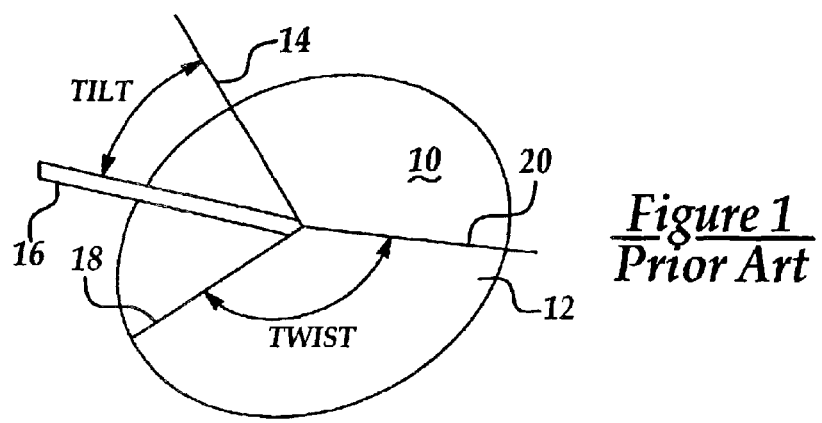
FIG. 1 illustrates the tilt angle and twist angle of a semiconductor wafer with respect to an ion beam.
Figure 2:
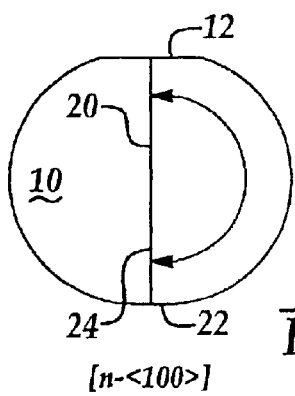
FIG. 2 illustrates a n-<100> type wafer.
Figure 3:
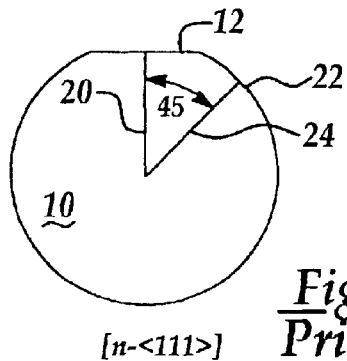
FIG. 3 illustrates a n-<111> type wafer.
Figure 4:
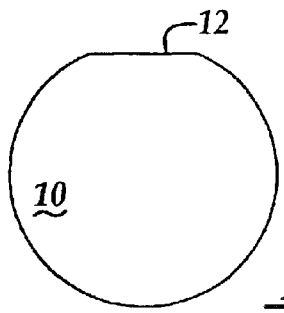
FIG. 4 illustrates a p-<111> type wafer.
Figure 5:
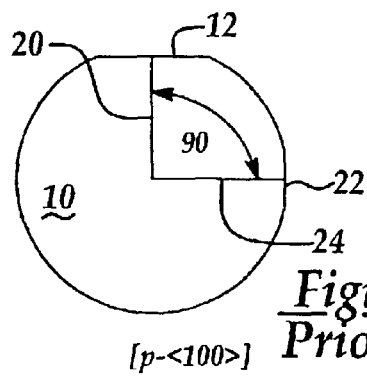
FIG. 5 illustrates a p-<100> type wafer.
Figure 6:
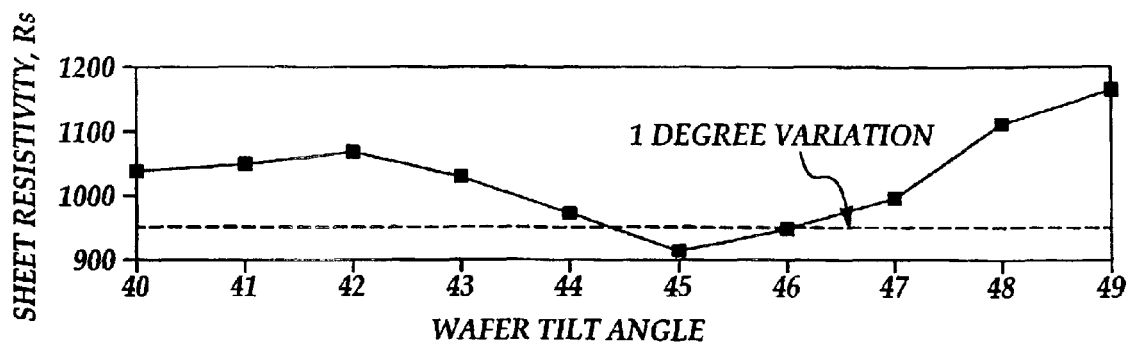
FIG. 6 is a graphical representation of the variation of sheet resistivity with wafer tilt angle for high angle ion implantation discovered according to the present invention.

According to the present invention a n-<100> type wafer without screen oxide was positioned to provide a tilt angle of 45 degrees and a twist angle of 45 degrees with respect to the ion beam to have a channel plane <100> pole. The wafer was implanted with boron species at a relatively high energy (160 KeV), high dose $5.0 \times 10^{13}$ atoms/cm$^2$. The sheet resistivity of the implanted region was measured using a four point probe and found to be equal to 905 ohms/square. Thereafter, the tilt angle of the wafer was varied in one degree increments from the 45 degree position and the process of implanting the boron species at the same energy and dose levels was repeated and the sheet resistivity at each angle position was measured. The results are illustrated and FIG. 6. It was discovered that a +/− change in the tilt angle produced a variation of 30 to 50 ohms per square from the sheet resistance at a 45 degree angle wafer tilt. That is, the sheet resistivity measurements had a sensitivity of at least 30 ohms/square for a one degree variation in the wafer tilt angle.

According to the present invention the sheet resistivity measurements can be utilized to monitor and adjust the wafer tilt angle to arrive at a tilt angle that is substantially at a true 45 degree angle. The process of monitoring and adjusting the wafer position for ion implantation may be conducted using the following actions. (A) Holding a semiconductor wafer in a wafer holder in a first implant position believed to be approximating 45 degrees with respect to the anticipated path of an ion beam from an ion implanter. Implanting ions into the wafer at a first energy and a first dose level, and measuring the sheet resistivity of the wafer implanted in the first implant position. (B) Holding the wafer in the wafer holder and tilting the wafer in a first direction to a second implant position, and implanting ions into the wafer at the first energy and first dose level, and measuring the sheet resistivity of the wafer implanted in the second implant position and comparing to the sheet resistivity measured in the immediately prior implant position of the wafer. If the sheet resistivity of the wafer implanted in the second implant position is less than the sheet resistivity of the wafer implanted in the first immediately prior implant position of the wafer and the difference between the measured sheet resistivity of the wafer in the second implant position and immediately prior implant position is greater than a target range, for example 1–5 ohms/square, then repeating (B); and if the difference in the measured sheet resistivity is within the target range then stopping the monitoring and adjusting of the wafer tilt angle. If the sheet resistivity of the wafer implanted in the second implant position is greater than the sheet resistivity of the wafer implanted in the immediately prior implant position, and the difference between the sheet resistivity of the wafer implanted in the second implant position in the wafer implanted in the immediately prior implant position is greater than a target range, for example 1–5 ohms/square, then (C) holding the wafer in the wafer holder and tilting the wafer, in the direction opposite to the direction that the wafer was tilted to arrive at the immediately prior implant position of the wafer in the holder, to a third implant position, implanting ions into the wafer at the first energy and first dose level and measuring the sheet resistivity of the wafer implanted in the third implant position and comparing to the sheet resistivity measured in the third implant position to the resistivity measured for the wafer implanted in the immediately prior implant position, and if the sheet resistivity of the wafer implanted in the third implant position is greater than the sheet resistivity of the wafer implanted in the immediately prior implant position, and if the difference between the sheet resistivity of the wafer implanted in the third implant position in the wafer implanted in the immediately prior implant position is greater than a target range, for example 1–5 ohms/square, then repeating (C); and if the difference in the measured sheet resistivity of the wafer implanted in the third implant position and the wafer in the immediately prior implant position is within the target range then stopping the monitoring and adjusting of the wafer tilt angle. This process can be used to arrive at a wafer tilt angle of 45 degrees or to realign the wafer tilt angle to 45 degrees after multiple production runs for any wafer type and using a variety of ion implant energy and dose levels and is not limited to only n-type wafers implanted at 160 KeV and $5.0 \times 10^{13}/cm^2$.

In another embodiment of the invention includes placing a first test wafer in a wafer holder positioned at a 45 degree tilt angle and a twist angle of 45 degrees with the anticipated path of an ion beam from an ion implanter. Implanting ions in a region of the first test wafer at a first energy (for example 160 KeV) and a first dose level (for example $5.0 \times 10^{13}$ atom/cm$^2$), and measuring the sheet resistivity of the implanted region of the first test wafer. Implanting a plurality of production wafers with ions. Implanting ions in a region of a second test wafer at the first energy level and the first dose level, and measuring the sheet resistivity thereof and readjusting the position of the wafer holder so that the wafer has a 45 degree tilt angle if the sheet resistivity of the second wafer is greater than 30 ohms/square with respect to the sheet resistivity measured for the first test wafer.

What is claimed is:

1. A method of monitoring and adjusting the position of a wafer with respect to an ion beam comprising:
    (A) setting the position of a wafer holder so that a wafer to be held therein is positioned at a tilt angle of 45 degrees and a twist angle of 45 degrees with respect to the path of an ion beam;
    (B) positioning a n-type wafer without screen oxide in the wafer holder;
    (C) implanting boron species into a region of the wafer at 160 KeV and a dose level of $5.0 \times 10^{13}$ atoms/cm$^2$,
    (D) repeating (B)–(C);
    (E) periodically measuring the sheet resistivity of an implanted wafer and readjusting the wafer holder when the difference in sheet resistivity measured is greater than 30 ohms/square.

2. A method of monitoring and adjusting the position of a wafer with respect to an ion beam comprising:
    placing a first test wafer in a wafer holder positioned at a 45 degree tilt angle and a twist angle of 45 degrees with the anticipated path of an ion beam from an ion implanter;
    implanting ions in a region of the first test wafer at a first energy and a first dose level, and measuring the sheet resistivity of the implanted region of the first test wafer;
    implanting a plurality of production wafers with ions;
    implanting ions in a region of a second test wafer at the first energy level and the first dose level, and measuring the sheet resistivity thereof and readjusting the position of the wafer holder so that the wafer has a 45 degree tilt angle if the sheet resistivity of the second wafer is greater than 30 ohms/square with respect to the sheet resistivity measured for the first test wafer.

3. A method as set forth in claim 2 wherein the first energy is about 160 KeV.

4. A method as set forth in claim 2 wherein the first dose is about $5.0 \times 10^{13}$ atoms/cm$^2$.

5. A method as set forth in claim 2 wherein the wafer comprises a n-type wafer.

6. A method as set forth in claim 2 wherein the ions comprise boron species.

* * * * *